(12) United States Patent
Fu et al.

(10) Patent No.: US 9,401,384 B2
(45) Date of Patent: *Jul. 26, 2016

(54) METHOD OF PREPARING SELF-ALIGNED ISOLATION REGIONS BETWEEN SENSOR ELEMENTS

(71) Applicant: TAIWAN SEMICONDUCTOR MANUFACTURING COMPANY, LTD., Hsinchu (TW)

(72) Inventors: Shih-Chi Fu, Zhudong Township (TW); Kai Tzeng, Ping-Pong Nei-Pui (TW); Wen-Chen Lu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/877,986

(22) Filed: Oct. 8, 2015

(65) Prior Publication Data

US 2016/0027839 A1    Jan. 28, 2016

Related U.S. Application Data

(60) Division of application No. 14/291,384, filed on May 30, 2014, now Pat. No. 9,171,876, which is a division of application No. 13/736,380, filed on Jan. 8, 2013, now Pat. No. 8,766,406, which is a continuation of application No. 12/871,032, filed on Aug. 30, 2010, now Pat. No. 8,367,512.

(51) Int. Cl.
*H01L 21/331* (2006.01)
*H01L 21/02* (2006.01)
(Continued)

(52) U.S. Cl.
CPC .... *H01L 27/14887* (2013.01); *H01L 21/76237* (2013.01); *H01L 27/1463* (2013.01);
(Continued)

(58) Field of Classification Search
CPC ................ H01L 27/14887; H01L 27/1463
USPC ........... 438/375, 407, 527, 185; 257/600–607
See application file for complete search history.

(56) References Cited

U.S. PATENT DOCUMENTS

| 6,177,333 B1 | 1/2001 | Rhodes |
| 6,849,496 B2 | 2/2005 | Jaiprakash et al. |

(Continued)

FOREIGN PATENT DOCUMENTS

| CN | 101164158 | 4/2008 |
| CN | 101783316 | 7/2010 |

(Continued)

OTHER PUBLICATIONS

Office action dated Jan. 17, 2014 from corresponding application No. TW 100123907.

(Continued)

*Primary Examiner* — Calvin Lee
(74) *Attorney, Agent, or Firm* — Hauptman Ham, LLP (57) ABSTRACT

A method of preparing self-aligned isolation regions between two neighboring sensor elements on a substrate includes patterning an oxide layer to form an opening between the two neighboring sensor elements on the substrate. The method further includes performing a first implant to form a deep doped region between the two neighboring sensor elements, wherein a top portion of the deep doped region is below a top surface of the substrate. The method further includes performing a second implant to form a shallow doped region between the two neighboring sensor elements, wherein a bottom portion of the shallow doped region overlaps with the top portion of the deep doped region.

20 Claims, 9 Drawing Sheets

(51) Int. Cl.
*H01L 27/148* (2006.01)
*H01L 21/762* (2006.01)
*H01L 27/146* (2006.01)
*H01L 31/18* (2006.01)

(52) U.S. Cl.
CPC .... *H01L27/14654* (2013.01); *H01L 27/14672* (2013.01); *H01L 27/14683* (2013.01); *H01L 27/14689* (2013.01); *H01L 31/18* (2013.01)

(56) References Cited

U.S. PATENT DOCUMENTS

| | | | |
|---|---|---|---|
| 7,217,589 B2 | 5/2007 | Rhodes et al. | |
| 7,388,187 B1 * | 6/2008 | Liu | H01L 27/1463 250/208.1 |
| 7,838,325 B2 | 11/2010 | Hsu et al. | |
| 7,968,424 B2 | 6/2011 | Lin et al. | |
| 8,367,512 B2 * | 2/2013 | Fu | H01L 27/76237 438/375 |
| 8,766,406 B2 * | 7/2014 | Fu | H01L 27/1463 257/607 |
| 9,171,876 B2 * | 10/2015 | Fu | H01L 27/1463 257/607 |
| 2005/0139877 A1 | 6/2005 | Rhodes et al. | |
| 2008/0217659 A1 * | 9/2008 | Hung | H01L 27/14654 257/223 |
| 2011/0249158 A1 | 10/2011 | Hynecek | |

FOREIGN PATENT DOCUMENTS

| | | |
|---|---|---|
| KR | 10-2005-0062143 | 6/2005 |
| TW | 200830381 | 7/2008 |
| TW | 200837937 | 9/2008 |

OTHER PUBLICATIONS

Office Action dated Jan. 5, 2015 from corresponding application No. CN 201110199311.1.

* cited by examiner

METHOD OF PREPARING SELF-ALIGNED ISOLATION REGIONS BETWEEN SENSOR ELEMENTS

PRIORITY CLAIM

The present application is a divisional of U.S. application Ser. No. 14/291,384, filed May 30, 2014, now U.S. Pat. No. 9,171,876, issued Oct. 27, 2015, which is a divisional of U.S. application Ser. No. 13/736,380, filed Jan. 8, 2013, now U.S. Pat. No. 8,766,406, issued Jul. 1, 2014, which is a continuation of U.S. application Ser. No. 12/871,032, filed Aug. 30, 2010, now U.S. Pat. No. 8,367,512, which are incorporated by reference in their entireties.

FIELD

The present disclosure relates generally to semiconductor devices, and more particularly, to image sensor devices.

BACKGROUND

Semiconductor image sensors are used for sensing radiation such as light. Complementary metal-oxide-semiconductor (CMOS) image sensors (CIS) and charge-coupled device (CCD) sensors are widely used in various applications such as digital still camera or mobile phone camera devices. These devices utilize an array of pixels in a substrate, including photodiodes and transistors that can absorb radiation projected toward the substrate and convert the sensed radiation into electrical signals. When a scene with a bright region is imaged onto an array of pixels, some of the pixels receive light from the bright region. The incident light in such pixels is more intense than other pixels receiving light from not-so-bright region(s). The charge created by the photosensitive elements of pixels receiving light from the bright region is high and could diffuse to adjacent pixels. As a result, the image of the bright region appears to be larger than its actual scene. This growth of a bright region is called "blooming." Charge created by one pixel diffuses to another pixel is also called "cross-talk." Cross-talk (or blooming) is not desirable and should be reduced or eliminated. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1A:
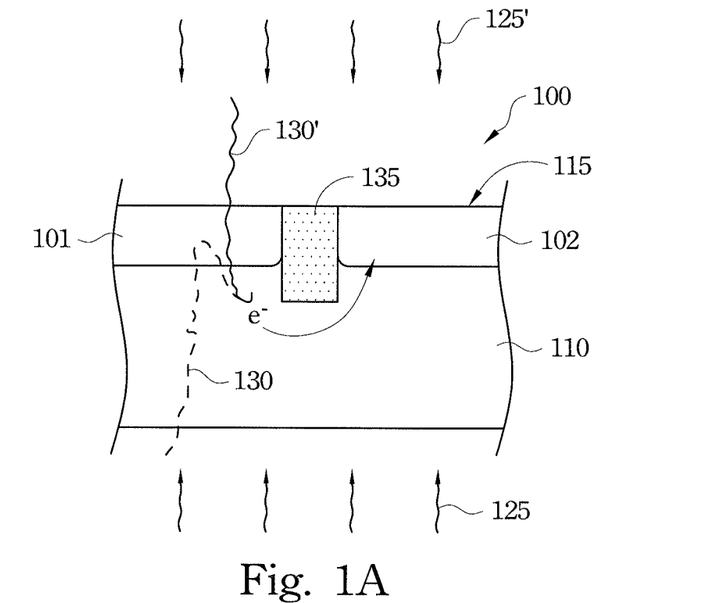
FIG. 1A shows a semiconductor device region with two neighboring sensor elements on a semiconductor substrate, in accordance with some embodiments.

FIG. 1A shows a semiconductor device 100 region on a semiconductor substrate 110, in accordance with some embodiments. The substrate 110 may include silicon in a crystalline structure. The substrate 110 may also include various p-type doped regions and/or n-type doped regions configured and coupled to form various devices and function features. All doping may be implemented using a process such as ion implantation or diffusion in various steps and techniques. The substrate 110 may include other features such as an epi layer, a semiconductor on insulator (SOI) structure, or combinations thereof.

The semiconductor device region 100 includes two neighboring sensor elements 101 and 102 (also referred to as pixels) formed in and/or on the front surface 115 of the semiconductor substrate 110. In one embodiment, the sensor elements 101 and 102 may be disposed on the front surface 115 and extend into the semiconductor substrate 110. The sensor elements 101 and 102 each include a light-sensing region (also referred to as an image sensing region or photo-sensing region) which may be a doped region having N-type and/or P-type dopants formed in the semiconductor substrate 110 by a method such as diffusion or ion implantation. Examples of sensor elements 101 and 102 include photodiodes, complimentary metal-oxide-semiconductor (CMOS) image sensors (CIS), charged coupling device (CCD) sensors, active sensors, passive sensors, and/or other devices diffused or otherwise formed in the substrate 110. In the context of the CIS, a pixel may include a photodiode and at least one transistor. As such, the sensor elements 101 and 102 may comprise conventional and/or future-developed image sensing devices.

In some embodiments, the semiconductor device region 100 includes a plurality of sensor elements, such as elements 101, and 102 disposed in an array. The plurality of sensor elements may be designed to have various sensor types. For example, one group of sensor elements may be CMOS image sensors and another group of sensor elements may be passive sensors. Moreover, the sensor elements, such as elements 101 and 102, may include color image sensors and/or monochromatic image sensors. The device region 100 may receive light directed towards the backside (125) or front-side (125') surface of the semiconductor substrate 110 during operations. In some embodiments, the substrate 110 is relatively thin so that the light directed through the back surface thereof may effectively reach the sensor elements 101 and 102.

In some embodiments, the semiconductor substrate 110 has a first type conductivity, for example, a P-type substrate. In some other embodiments, the semiconductor substrate 110 may have a second type conductivity, for example, an N-type substrate. In addition, the semiconductor substrate 110 may include various doped regions each having an N-type or P-type, such as an N-well or P-well. Furthermore, the plurality of sensor elements, such as elements 101 and 102, may be photodiodes that are formed by implanting N-type dopant into a P-type substrate. Pinned photodiodes may be formed by forming a P-type pinned layer over the surface of the N-type photodiodes.

Isolation features 135 are positioned between sensor elements 101 and 102. In some embodiments, the isolation features 135 are dielectric-filled trench structures, such as shallow trench isolation (STI) structures. In some other embodiments, the isolation features 135 are doped wells (or doped region). For example, if sensor elements 101 and 102 are N-type photodiodes, the isolation features 135 could be a P-doped well. In yet some other embodiments, each of the isolation features 135 may include a combination of an STI structure and a doped well.

When light 130 or 130' is projected towards the front (130') or back (130) side of the substrate 110 to reach the sensor element 101, the electron(s) (or holes) generated by the light 130 or 130' may diffuse to the neighboring sensor element 102 through the semiconductor substrate 110 below the isolation features 135, which creates cross-talk (or blooming). As the pixel pitch of the sensor elements shrinks, cross-talk (or blooming) between the pixels is exacerbated.

Figure 1B:
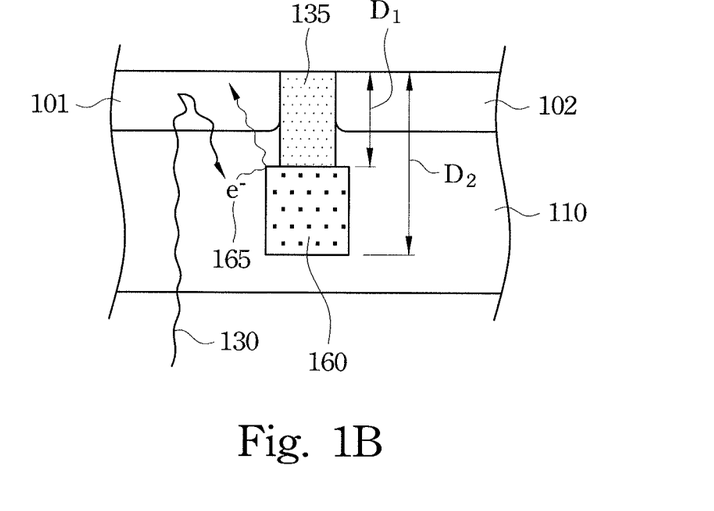
FIG. 1B shows the semiconductor device region of FIG. 1A with a deep doped region, in accordance with some embodiments.

In order to reduce cross-talk between the plurality of sensor elements, such as elements 101 and 102, ion implantation in combination with substrate patterning can be used to form a doped region 160 below the isolation features 135. The doped region may be a first-type doped region, such as P-type doped region. The depth of the doped region 160 is greater than the depth of the sensor elements 101 and 102 and slightly overlaps with the isolation feature 135, as shown in FIG. 1B in accordance with some embodiments. In this way, cross-talk between the sensor elements may be effectively reduced or eliminated.

The ion implantation may be performed with a tilt angle from about 0 to about 90 degrees. In some embodiments, the range of energy to apply in the ion implantation is from about 10 to about 2000 KeV. In some other embodiments, the range of energy is from about 300 to 3000 KeV. By implanting ions with different energy values, different depth of the doped regions 160 may be achieved. A higher energy value provides a deeper ion implantation and a lower energy value provides a shallow implantation. The depth of the doped region 160 is at least greater than the depth of the sensor elements 101 and 102. FIG. 1B shows that an electron 165, generated by light 130 in sensor element 101, is repelled back by the deep doped region 160 to be back into the sensor element 101. In some embodiments, the depth "D1" of the isolation feature 135 is in a range from about 0.1 μm to about 1.0 μm. In some embodiments, the depth D2 of the deep well region 160 is from about 0.3 μm to about 3 μm.

The demand for higher image quality, such as digital-still-camera-like (or DSC-like) quality for mobile application, requires decreasing pixel size while maintaining full-well capacity, quantum efficiency, and sensitivity. Meeting such demands becomes very challenging. In some embodiments, the width of CIS using BSI is in a range from about 0.5 μm to about 3 μm. With the decreasing pixel size, the sizes of the isolation features between pixels also decrease to enable more pixels to be packed into the semiconductor chip.

Figure 2A:
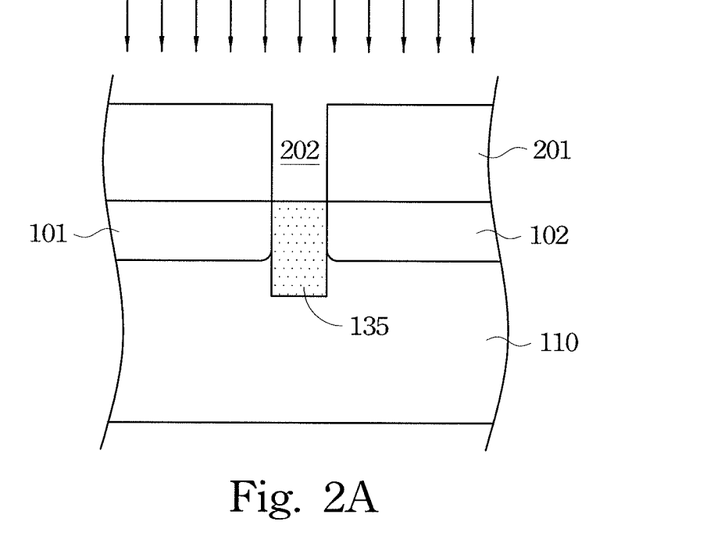
FIG. 2A shows a photoresist layer used to create pattern with an opening for ion implantation to create an isolation feature, in accordance with some embodiments.

FIG. 2A shows a photoresist layer 201 used to create pattern with an opening 202 for ion implantation to create (or form) the isolation feature 135, in accordance with some embodiments. The photoresist layer 201 protects the surfaces under photoresist 201 from being implanted with dopant.

With the decreasing pixel size, the width of the opening 202 (and also the width of isolation feature 135) becomes increasing small. In some embodiments, the width of the opening is in a range between about 0.1 μm to about 1.0 μm. As described above, the depth "D1" of the isolation feature 135 is in a range between about 0.1 μm to about 1.0 μm, in accordance with some embodiments.

Figure 2B:
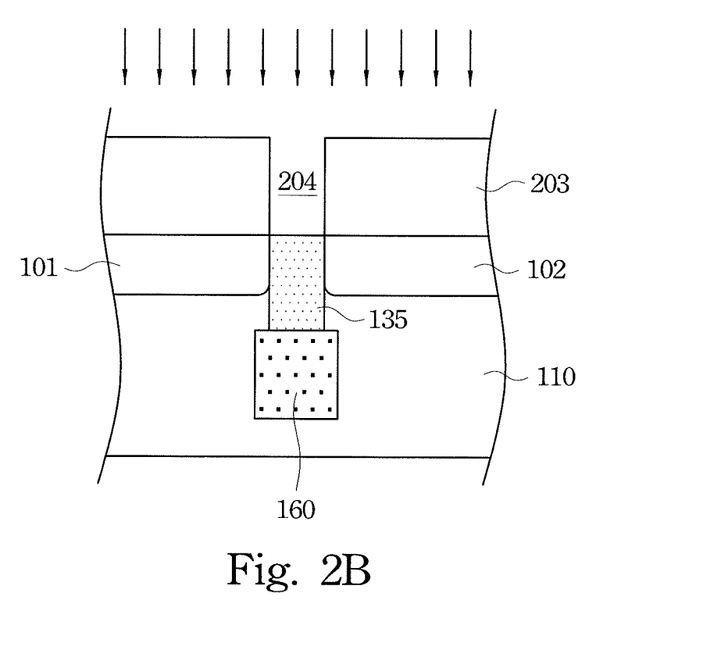
FIG. 2B shows a photoresist layer formed on the substrate of FIG. 2A to create another opening for ion implantation for forming a deep doped region, in accordance with some embodiments.

After implant is performed to create isolation feature, the photoresist layer 201 is removed and another photoresist layer 203 is formed on substrate 110 to create another opening 204 for ion implantation for forming the deep doped region 160, as shown in FIG. 2B in accordance with some embodiments. The opening 204, which also defines the width of region 160, has a size about equal to or greater than the size of opening 202. Since the deep doped region 160 is below sensor elements 101 and 102, its width can be larger without impacting the density of the pixels. In some embodiments, the width of the opening 204 is in a range between about 0.1 μm to about 1.0 μm. As mentioned above, the depth D2 of the deep well region 160 is between about 0.3 μm to about 3 μm, in accordance with some embodiments. Deep well region 160 should overlap with the isolation feature 130 to ensure good isolation between sensor elements 101 and 102. FIG. 1B shows that that deep well region 160 covers from at least from D1 to D2. As mentioned above, the implant energy for region 160 is high and could be between about 300 to about 3000 KeV in some embodiments.

For deep well implant, the thickness of photoresist layer 203 is larger. In some embodiments, the thickness is in a range between about 1.0 μm to about 4.0 μm. With such thick photoresist and small width of opening (204), the aspect ratio of the opening 204 could be very high, such as 5, 10, 15, or 20. Patterning photoresist layer with openings with high aspect ratios is not easy. Patterning photoresist with small openings often leaves scum near bottom of the openings and also the photoresist near the top of the openings tends to be rounded (resist rounding). Such issues impact the proper formation of the deep well region 160. As a result, other patterning mechanisms are needed for advanced technologies with small width of implant regions.

Figure 3A:
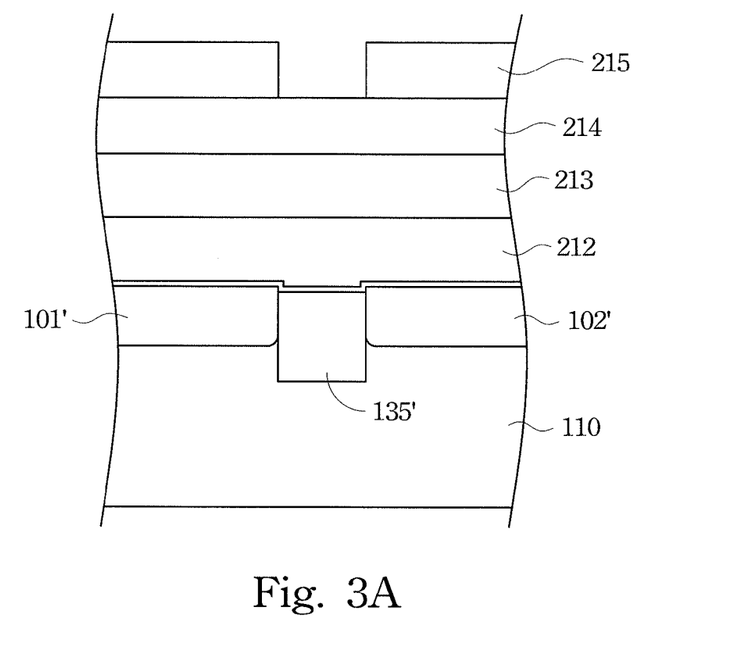
FIGS. 3A-3L show cross-sectional views of processing sequence for creating deep and shallow doped regions, in accordance with some embodiments.

FIG. 3A shows a cross-sectional view of substrate 110 being patterned to create a deep doped region, in accordance with some embodiments. Substrate 110 has sensor elements 101' and 102' divided by an isolation feature 135', which is a shallow trench isolation (STI) filled with oxide. A etch stop layer 211 is deposited over substrate 110 over the sensor elements, such as elements 101' and 102', and the STI isolation feature 135'. The etch stop layer 211 is used as an etch stop for an oxide layer (212 above layer 211) and can be made of SiN, SiC, SiON, or other applicable materials. The thickness of the etch stop layer 211 is in a range between about 200 Å about to about 3000 Å, in accordance with some embodiments. An oxide layer 212 is deposited over the etch stop layer 211. Oxide layer 212 will be used as an implant mask after it is patterned. Alternatively, layer 212 may be made of silicon nitride, other type of dielectric material, or a composite dielectric layer. In some embodiments, the oxide layer 212 is deposited by a plasma-enhanced chemical vapor deposition (PECVD) process. The thickness of the oxide layer 212 is in a range between about 15000 Å about to about 40000 Å, in accordance with some embodiments.

After the oxide layer 212 is deposited, an amorphous carbon layer 213 is deposited over layer 212. In some embodiments, the amorphous carbon layer 213 is deposited by a PECVD process. The thickness of the amorphous carbon layer 213 is in a range between about 3000 Å about to about 15000 Å, in accordance with some embodiments. Over the amorphous carbon layer 213, a hard mask layer 214 is deposited. The hard mask layer may be made of SiON, SiN, SiC, SiOC, or other applicable materials. In some embodiments, the hard mask layer 214 is deposited by a PECVD process. The thickness of the hard mask layer 214 is in a range between about 100 Å about to about 2000 Å, in accordance with some embodiments. Over the hard mask layer 214 is a photoresist layer 215. The thickness of the photoresist layer 215 is in a range between about 1000 Å about to about 10000 Å, in accordance with some embodiments.

Figure 3B:
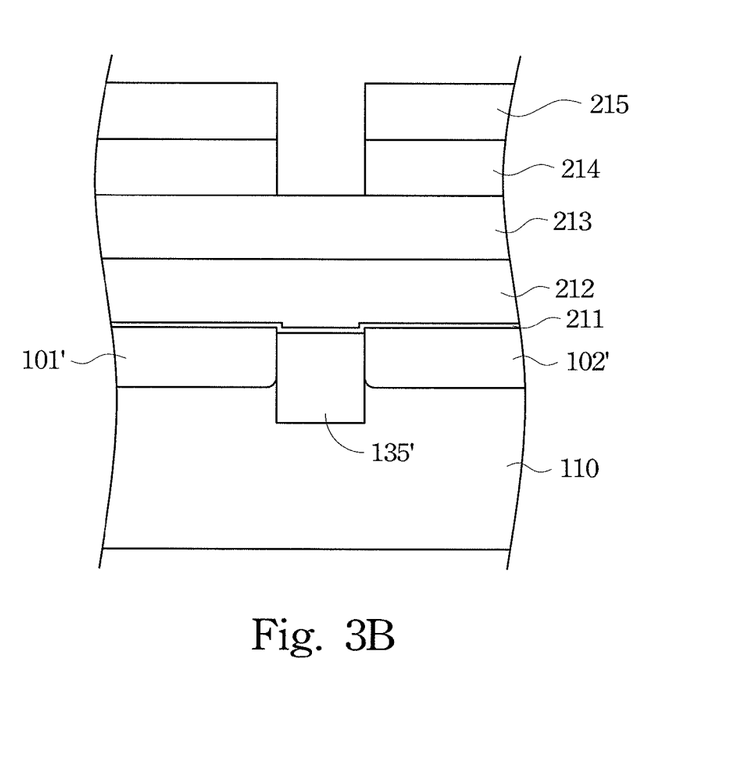
Figure 3C:
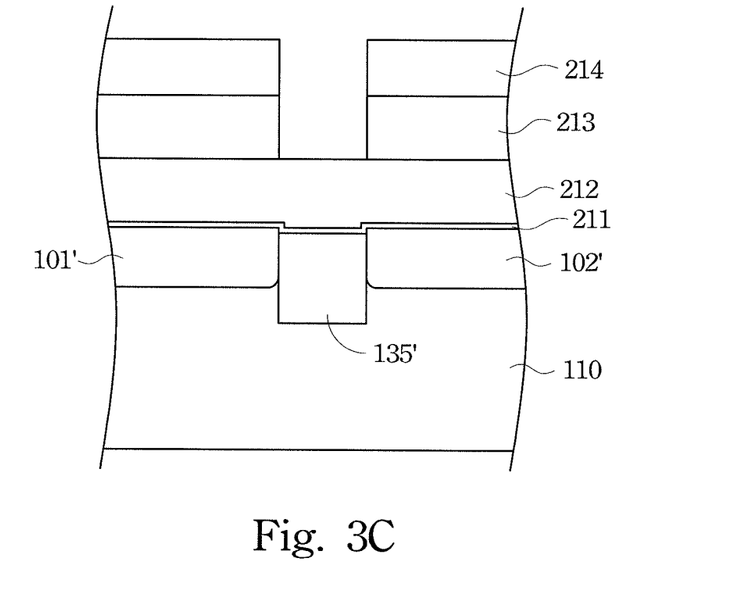
Figure 3D:
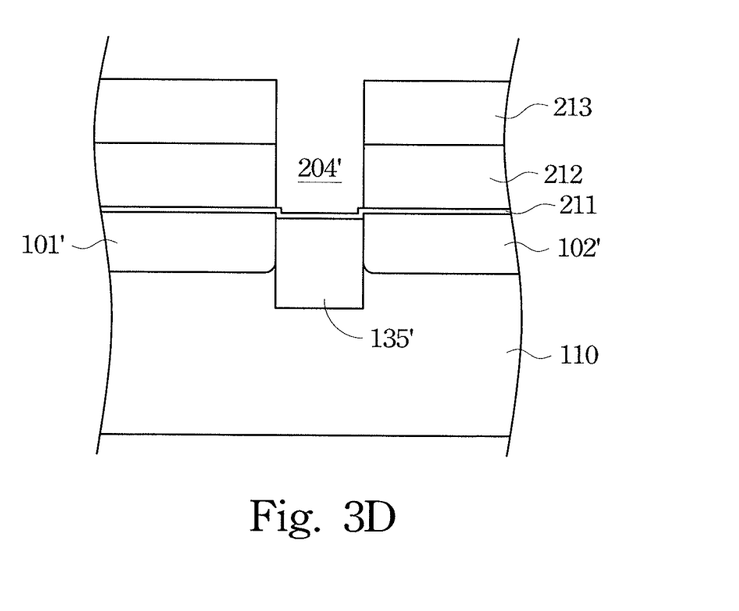

The oxide layer 212 is used as an implant mask. Layers 213, 214, and 215 are used to pattern the implant mask 212. Since the thickness of the photoresist layer 215 is much thinner than the photoresist layer 203 described above, issues for photoresist layer 203, such as scum and resist rounding, do not affect patterning of photoresist layer 215. Photoresist layer 215 is used as a mask to pattern (or etch) hard mask layer 214, as shown in FIG. 3B, in accordance with some embodiments. Afterwards, the amorphous carbon layer 213 is patterned by using the hard mask layer 214 as a mask. During the etching of the amorphous carbon layer 213, the photoresist layer 215 could be removed by the etching chemistry for the amorphous carbon layer 213, in accordance with some embodiments. FIG. 3C shows the photoresist layer 215 being removed after the etching of the amorphous carbon layer 213, in accordance with some embodiments. Afterwards, the amorphous carbon layer 213 is uses as an etching mask for etching the oxide layer 212. During this operation, the hard mask layer 214 could be removed by the oxide etching chemistry, in accordance with some embodiments. FIG. 3D shows the oxide layer 212 etched to create an opening 204' for deep well implantation, in accordance with some embodiments. After the oxide layer 212 is etched, the amorphous carbon layer 213 (mask) can be removed by ashing with a process gas that contains oxygen.

As mentioned above, the patterned oxide layer 212 is used as an implant mask. In some embodiments, the size of the opening 204' is similar to the size of opening 204. Oxide etching can create high aspect ratios without issues related to photoresist patterning mentioned above. In some embodiments, the aspect ratios of openings of the oxide implant mask are equal to or greater than about 5. In some embodiments, the aspect ratios of openings of the oxide implant mask are equal to or greater than about 10. In some other embodiments, the aspect ratios are equal to or greater than about 15. In yet some other embodiments, the aspect ratios are equal to or greater than about 20.

Figure 3E:
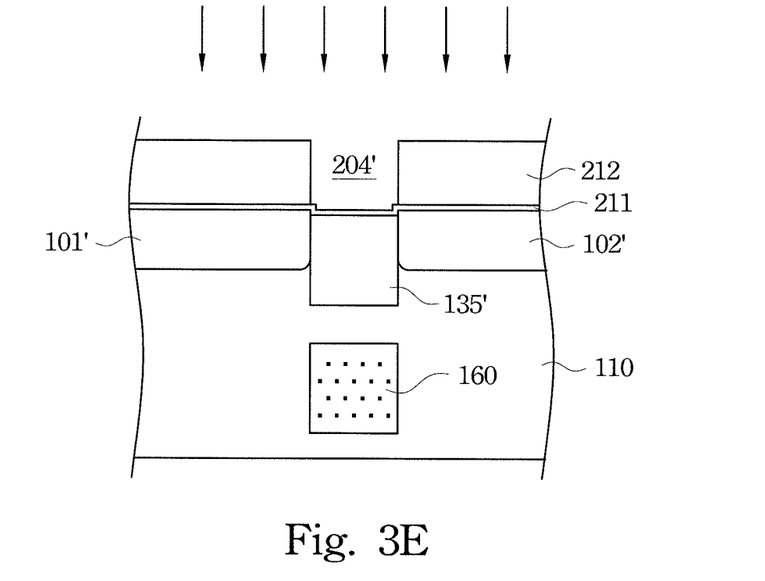

Ion implantation is then performed on substrate 110 to create the deep well region 160, as shown in FIG. 3E in accordance with some embodiments. FIG. 3E shows a space between the bottom of the STI isolation feature 135' and the top of the deep well region 160. The space between the STI isolation feature 135' and the deep well region 160 needed to be filled with dopants to isolate sensor elements 101' and 102'. In some other embodiments, there is no space between the STI isolation feature 135' and the deep well region 160 and the STI isolation feature 135' and the deep well region 160 overlap.

Figure 3F:
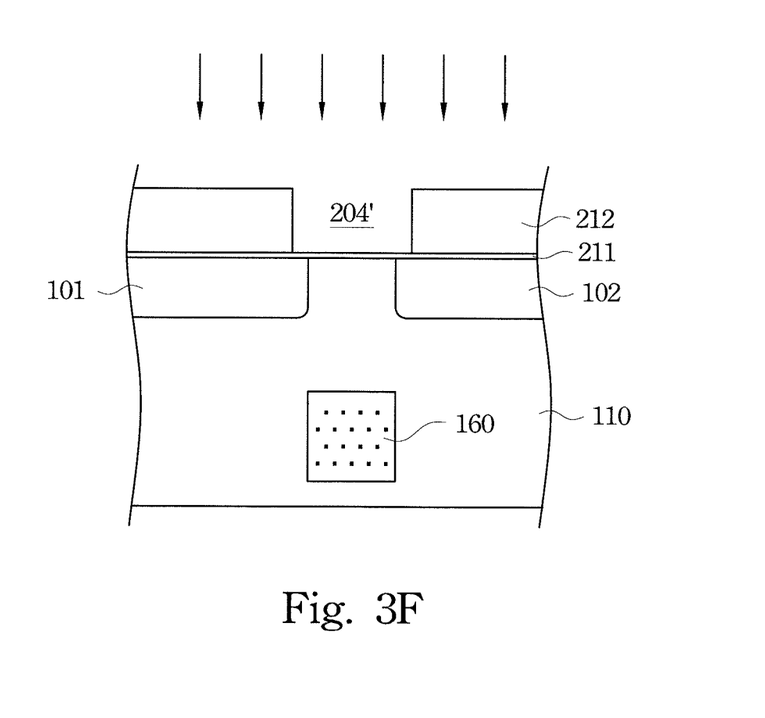
Figure 3G:
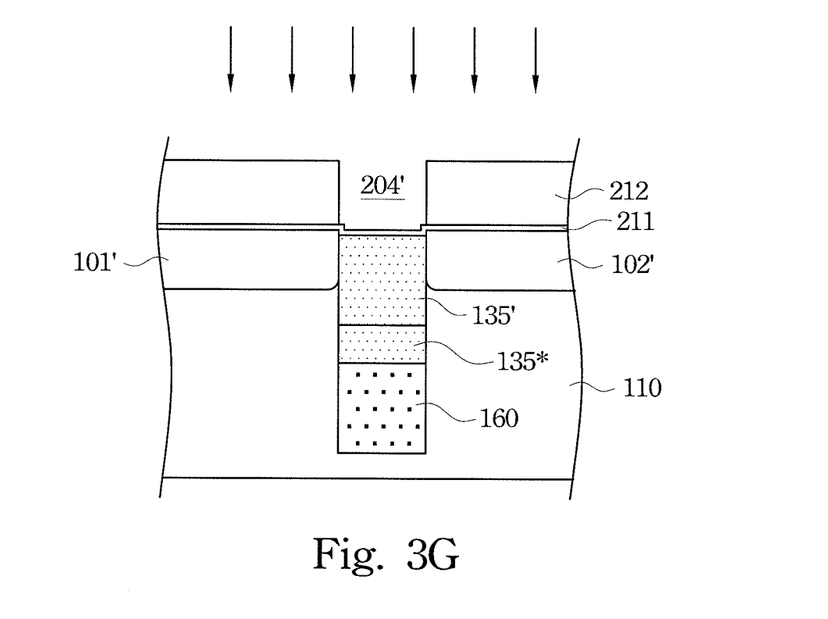
Figure 3H:
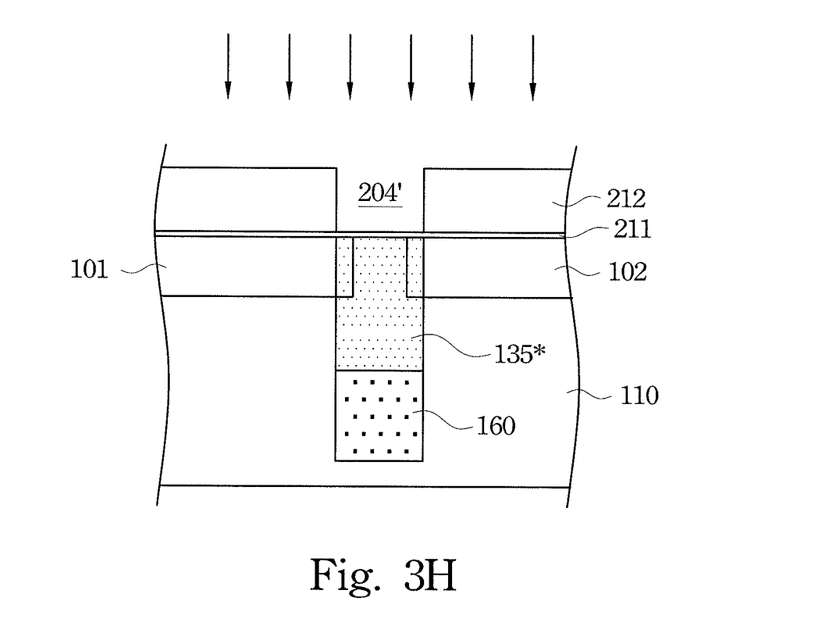

The structure shown in FIG. 3E is only an exemplary embodiment. As described above, the sensor elements may be isolated bys isolation features made of implant regions, not STI structures. FIG. 3F shows substrate 110 with sensor elements 101 and 102 after the formation of deep well region 160, in accordance with some embodiments. The isolation feature (a shallow implant region or implant well) between sensor elements 101 and 102 is not formed yet. The structures in both FIGS. 3E and 3F need shallower implant wells to isolate sensor elements 101' and 102', and 101 and 102. In some embodiments, the oxide layer 212 may be used as an implant mask for shallower isolation 135* between sensor elements 101' and 102' (as shown in FIG. 3G), and between sensor elements 101 and 102 (as shown in FIG. 3H). Different energy level and implant dozes are used to create isolation regions 135* in FIGS. 3G and 3H. In some embodiments, the implant energy is in a range from about 10 KeV to about 2000 KeV.

Figure 3I:
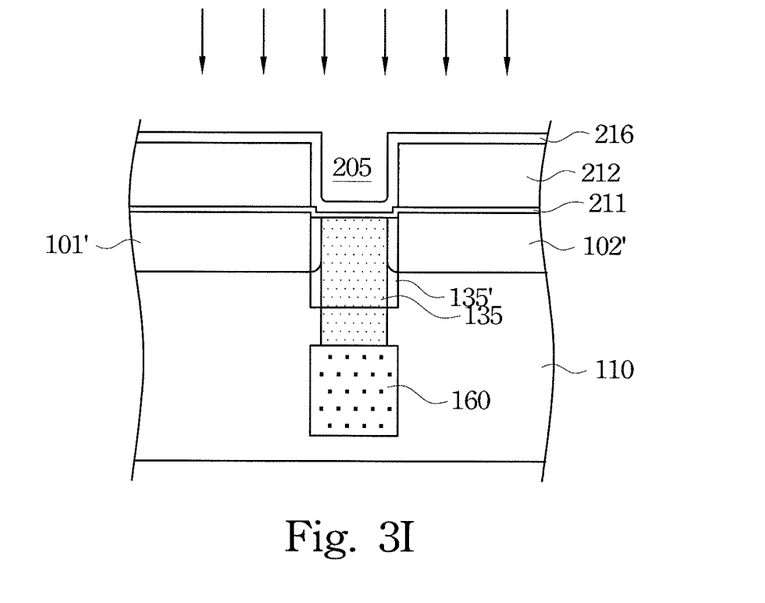
Figure 3J:
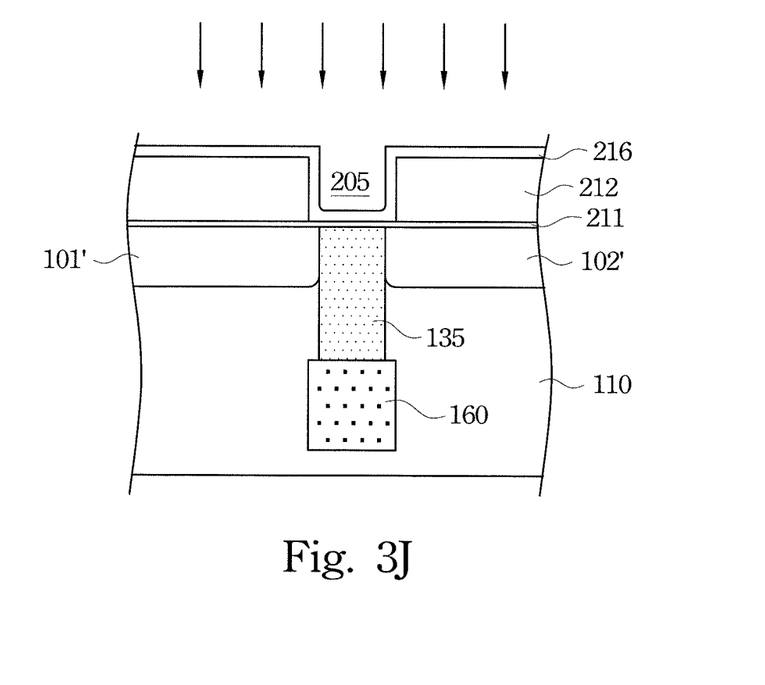

As mentioned above, the widths of the implant isolation features between sensor elements, such as elements 101, 102, 101' and 102', decrease with pixel sizes. In some embodiments, the widths of the shallow isolation regions 135 are narrower than the deep well region 160 to fit more pixels in a given substrate area. A conformal dielectric layer 216 can be deposited over the oxide layer 212 to decrease the size of opening 205 for implant (shallow implant), as shown in FIGS. 3I and 3J in accordance with some embodiments. In some embodiments, the size of opening 205 is similar to the size of opening 202. In some embodiments, the aspect ratios of openings of the implant mask with the conformal layer are equal to or greater than about 10. In some other embodiments, the aspect ratios are equal to or greater than about 15. In yet some other embodiments, the aspect ratios are equal to or greater than about 20.

The conformal dielectric can be an oxide, a nitride, or an oxynitride film. In some embodiments, the thickness of the dielectric film is in a range between about 50 Å to about 500 Å. In some embodiments, the conformal dielectric layer 216 is deposited by an atomic layer deposition (ALD) or a metal-organic chemical vapor deposition (MOCVD) process. Both ALD and MOCVD processes can provide conformal films. Other applicable deposition techniques that produce conformal dielectric films can also be used.

Figure 3K:
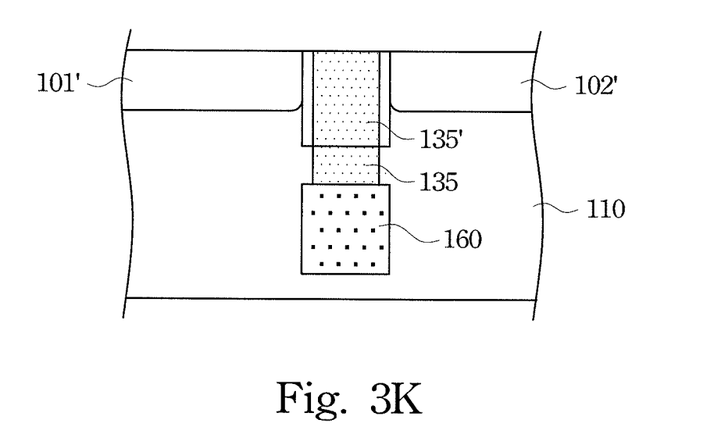
Figure 3L:
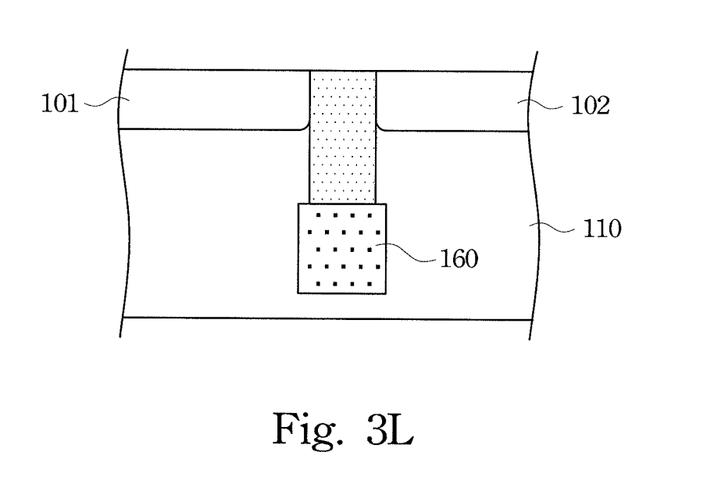

After the shallow isolation features (or wells), 135* or 135, are formed, dielectric layers 212, 211, and 216 (if used) are removed by etching process(es). FIGS. 3K and 3L show the cross-sectional views FIGS. 3I and 3J after the dielectric layers 212, 211, and 216 have been removed, in accordance with some embodiments. By using a conformal dielectric layer 216 to decrease width of shallow isolation regions (or wells) 135, no alignment or overlay of mask layers is needed. Actually, the lithographic patterning process to define the shallow isolation regions 135 is skipped entirely. Lithographic patterning is an expensive procedure, especially for fine features. The self-aligned process described above saves cost.

Figure 4:
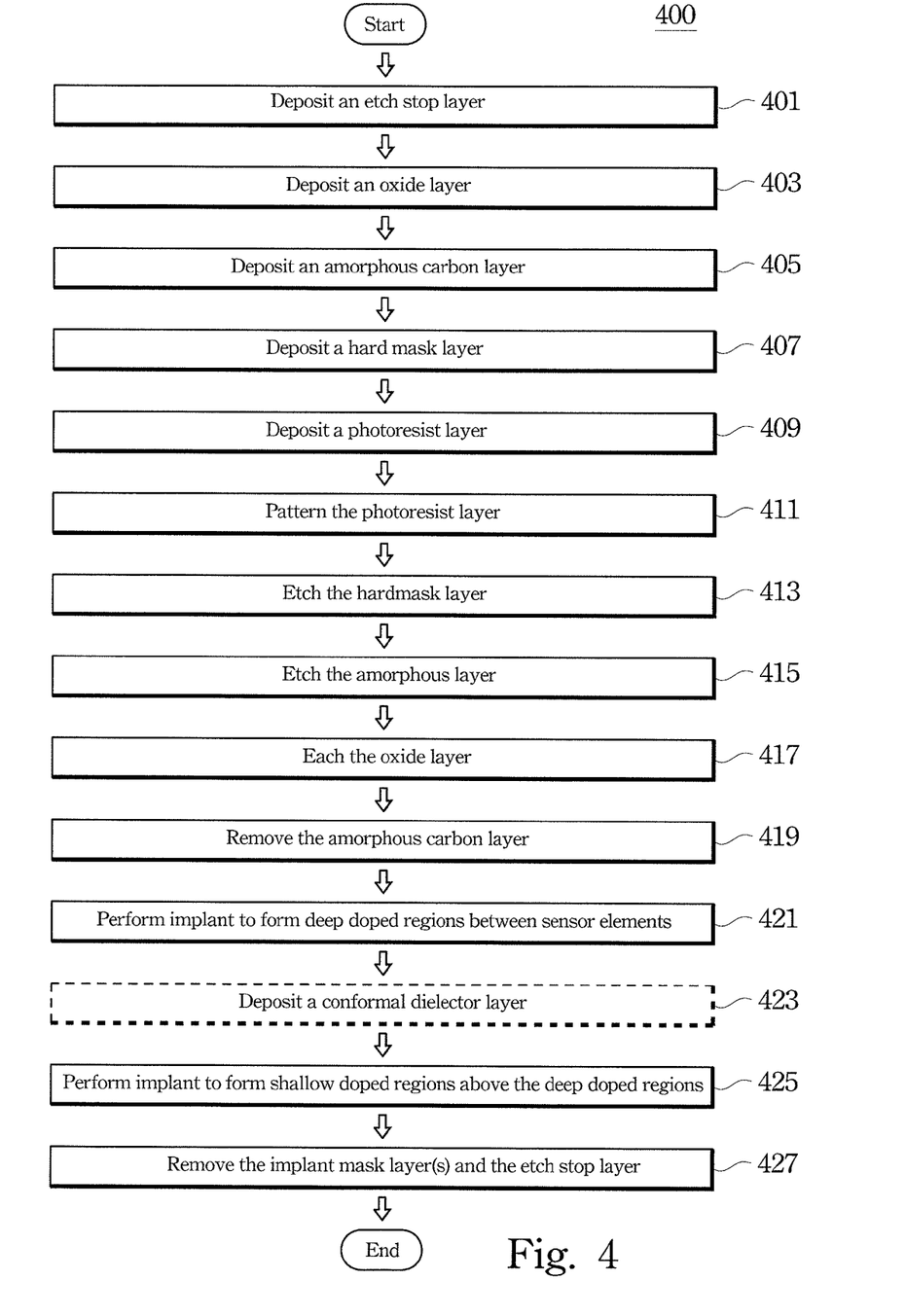
FIG. 4 shows a process flow for forming isolation features between sensor elements, in accordance with some embodiments.

FIG. 4 shows a process flow 400 for forming isolation features between sensor elements, in accordance with some embodiments. In the first portion of the process flow 400, an implant mask for forming a deep doped region is form. At operation 401, an etch stop layer is deposited on a substrate, which has regions of sensor elements defined. The etch stop layer is described above as layer 211. At operation 403, an oxide layer is deposited over the etch stop layer. The oxide layer is described above as layer 212. Afterwards, an amorphous carbon layer is deposited at operation 405. The amorphous carbon layer is described above as layer 213. A hard mask layer is deposited over the amorphous carbon layer at operation 407. The hard mask layer is described above as layer 214. A photoresist layer is then deposited over the hard mask layer at operation 409. The photoresist layer is described above as layer 215.

Afterwards, the patterning of the photoresist layer is formed at operation 411. The patterning process may involve photolithography and wet process to remove photoresist from open areas (areas with openings) on the substrate. Following the photoresist patterning, the hard mask layer is etched by using the photoresist layer as an etching mask at operation 413. At operation 415, the amorphous carbon layer is etched by using the hard mask layer as an etching mask. Afterwards, the oxide layer is etched by using the amorphous carbon layer as an etching mask at operation 417. The amorphous carbon layer is then removed from the substrate, such as by ashing, at operation 419. After operation 419, the implant mask for forming a deep doped region is formed.

An ion implantation is performed at operation 421 using the oxide layer as an implant mask. The ion implantation is used to form deep doped regions (or wells) between neighboring sensor elements. Following the implant at operation 421, an optional operation 423 is performed to deposit a conformal dielectric layer to line the surface of the oxide layer. Operation 423 is only needed if the shallow isolation regions to be formed afterwards are smaller (in widths) than the deep doped regions. Afterwards, implant is performed to form shallow isolation regions between the sensor elements and above the deep doped regions at operation 425. The oxide layer (implant mask), the etch stop layer and the optional conformal layer (if available), which is part of an implant mask for forming the shallow doped regions, are then removed at operation 427.

The embodiments of methods of preparing self-aligned isolation regions between two neighboring sensor elements on a substrate described above enable reducing cross-talk (or blooming) of neighboring. The methods use an oxide implant mask to form a deep doped region and also to form a shallow doped region. In some embodiments, the shallow doped regions are narrower and are formed by depositing a conformal dielectric layer over the oxide implant mask to narrow the openings for implantation.

In one embodiment, a method of preparing self-aligned isolation regions between two neighboring sensor elements on a substrate to reduce cross-talk of the two neighboring sensor elements is provided. The method includes patterning an oxide layer to form an oxide implant mask with an opening between the two neighboring sensor elements on the substrate. The method also includes performing a first implant to form a deep doped region between the two neighboring sensor elements and starting at a distance below a top surface of the substrate. The method further includes performing a second implant to form a shallow doped region between the two neighboring sensor elements after performing the first implant. The deep doped region and the shallow doped region are self-aligned. A bottom portion of the shallow doped region overlaps with a top portion of the deep doped region, and the shallow doped region and the deep doped region prevent electrons from flowing between the two neighboring sensor elements.

In another embodiment, a method of preparing self-aligned isolation regions between two neighboring sensor elements on a substrate to reduce cross-talk of the two neighboring sensor elements is provided. The method includes patterning a dielectric layer to form a dielectric implant mask with an opening between the two neighboring sensor elements on the substrate. The method also includes performing a first implant to form a deep doped region between the two neighboring sensor elements and starting at a distance below a top surface of the substrate. The method further includes depositing a conformal dielectric layer over the dielectric implant mask to reduce the width of the opening to a new width after performing the first implant and before performing the second implant. In addition, the method includes performing a second implant to form a shallow doped region between the two neighboring sensor elements after performing the first implant. The deep doped region and the shallow doped region are self-aligned, and a bottom portion of the shallow doped region overlaps with a top portion of the deep doped region. The shallow doped region and the deep doped region prevent electrons from flowing between the two neighboring sensor elements.

One aspect of this description relates to a method of preparing self-aligned isolation regions between two neighboring sensor elements on a substrate. The method includes patterning an oxide layer to form an opening between the two neighboring sensor elements on the substrate. The method further includes performing a first implant to form a deep doped region between the two neighboring sensor elements, wherein a top portion of the deep doped region is below a top surface of the substrate. The method further includes performing a second implant to form a shallow doped region between the two neighboring sensor elements, wherein a bottom portion of the shallow doped region overlaps with the top portion of the deep doped region.

Another aspect of this description relates to a method of preparing self-aligned isolation regions between two neighboring sensor elements on a substrate. The method includes patterning an oxide layer to form an opening between the two neighboring sensor elements on the substrate. The method further includes performing a first implant to form a deep doped region below the two neighboring sensor elements, wherein a top portion of the deep doped region is below a top surface of the substrate. The method further includes forming a shallow trench isolation (STI) in the substrate between the neighboring sensor elements. The method further includes performing a second implant to form a shallow doped region between the two neighboring sensor elements, wherein a bottom portion of the shallow doped region overlaps with the top portion of the deep doped region.

Still another aspect of this description relates to a method of preparing self-aligned isolation regions between two neighboring sensor elements on a substrate. The method includes patterning an oxide layer to form an opening between the two neighboring sensor elements on the substrate. The method further includes performing a first implant to form a deep doped region below the two neighboring sensor elements, wherein a top portion of the deep doped region is below a top surface of the substrate. The method further includes reducing a width of the opening. The method further includes performing a second implant through the opening having the reduced width to form a shallow doped region between the two neighboring sensor elements, wherein a bottom portion of the shallow doped region overlaps with the top portion of the deep doped region.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of preparing self-aligned isolation regions between two neighboring sensor elements on a substrate, the method comprising:
patterning an oxide layer to form an opening between the two neighboring sensor elements on the substrate;

performing a first implant to form a deep doped region between the two neighboring sensor elements, wherein a top portion of the deep doped region is below a top surface of the substrate; and performing a second implant to form a shallow doped region between the two neighboring sensor elements, wherein a bottom portion of the shallow doped region overlaps with the top portion of the deep doped region.

2. The method of claim 1, wherein performing the second implant comprises decreasing a size of the two neighboring sensor elements.

3. The method of claim 1, further comprising removing the oxide layer after the second implant.

4. The method of claim 1, further comprising forming a shallow isolation feature in the substrate between the two neighboring sensor elements, wherein the shallow isolation feature is formed prior to the first implant.

5. The method of claim 1, wherein patterning the oxide layer comprises exposing a portion of the two neighboring sensor elements.

6. The method of claim 1, further comprising depositing a conformal dielectric layer over the patterned oxide layer.

7. The method of claim 6, wherein performing the second implant comprises performing the second implant through the conformal dielectric layer.

8. The method of claim 1, further comprising forming an etch stop layer between the substrate and the oxide layer.

9. The method of claim 8, wherein performing the first implant comprises performing the first implant through the etch stop layer.

10. The method of claim 8, wherein performing the second implant comprises performing the second implant through the etch stop layer.

11. A method of preparing self-aligned isolation regions between two neighboring sensor elements on a substrate, the method comprising:

patterning an oxide layer to form an opening between the two neighboring sensor elements on the substrate;

performing a first implant to form a deep doped region below the two neighboring sensor elements, wherein a top portion of the deep doped region is below a top surface of the substrate;

reducing a width of the opening; and performing a second implant through the opening having the reduced width to form a shallow doped region between the two neighboring sensor elements, wherein a bottom portion of the shallow doped region overlaps with the top portion of the deep doped region.

12. The method of claim 11, further comprising forming a shallow trench isolation (STI) in the substrate between the two neighboring sensor elements.

13. The method of claim 11, wherein performing the first implant comprises implanting dopants having a different dopant type from a dopant type of the two neighboring sensor elements.

14. The method of claim 11, wherein reducing the opening comprises depositing a conformal layer over the oxide layer.

15. The method of claim 14, wherein performing the second implant comprises performing the second implant through the STI.

16. A method of preparing self-aligned isolation regions between two neighboring sensor elements on a substrate, the method comprising:

patterning an oxide layer to form an opening between the two neighboring sensor elements on the substrate;

performing a first implant to form a deep doped region below the two neighboring sensor elements, wherein a top portion of the deep doped region is below a top surface of the substrate;

forming a shallow trench isolation (STI) in the substrate between the neighboring sensor elements; and performing a second implant to form a shallow doped region between the two neighboring sensor elements, wherein a bottom portion of the shallow doped region overlaps with the top portion of the deep doped region.

17. The method of claim 16, wherein performing the first implant comprises performing the first implant through the STI.

18. The method of claim 16, wherein performing the second implant comprises performing the second implant through the STI.

19. The method of claim 16, wherein performing the second implant comprises forming the shallow doped region having a width different from a width of the deep doped region.

20. The method of claim 16, wherein performing the second implant comprises forming the shallow doped region having a width equal to a width of the deep doped region.

* * * * *